United States Patent [19]

Ogawa et al.

[11] Patent Number: 5,648,680
[45] Date of Patent: Jul. 15, 1997

[54] LEAD-ON-CHIP SEMICONDUCTOR DEVICE

[75] Inventors: Junji Ogawa; Masato Takita, both of Kawasaki, Japan

[73] Assignee: Fujitsu Limited, Kawasaki, Japan

[21] Appl. No.: 536,674

[22] Filed: Sep. 29, 1995

Related U.S. Application Data

[63] Continuation of Ser. No. 224,196, Apr. 7, 1994, abandoned, which is a continuation of Ser. No. 948,039, Sep. 21, 1992, abandoned.

[30] Foreign Application Priority Data

Sep. 20, 1991 [JP] Japan .................... 3-241045

[51] Int. Cl.⁶ .................................. H01L 23/495
[52] U.S. Cl. ................ 257/666; 257/690; 257/691; 257/692; 257/696
[58] Field of Search .................... 257/689, 691, 257/666, 690, 692, 693, 696, 698

[56] References Cited

U.S. PATENT DOCUMENTS 4,951,122  8/1990  Tsubosaki et al. .............. 357/72
5,068,712  11/1991  Murakami et al. ............. 257/689
5,151,559  9/1992  Conru et al. .................. 257/666

FOREIGN PATENT DOCUMENTS 198194  10/1985  European Pat. Off. .
204177  12/1985  European Pat. Off. .
295459  12/1988  European Pat. Off. .

OTHER PUBLICATIONS

European Search Report dated Jan. 7, 1993.

*Primary Examiner*—Carl W. Whitehead, Jr.
*Attorney, Agent, or Firm*—Nikaido, Marmelstein, Murray & Oram LLP

[57]  ABSTRACT

A semiconductor includes a Lead-on-chip (LOC) structure. A bonding pad solely for receiving a signal is formed parallel to a perimeter on top in the middle of the element-formation surface. A bonding pad solely for transmitting a signal is formed around the periphery of the element-formation surface, and an inner lead solely for receiving a signal has its tip positioned parallel to the perimeter on top in the middle of the element-formation surface. An inner lead solely for transmitting a signal has its tip positioned on top of the periphery of the element-formation surface.

20 Claims, 8 Drawing Sheets

LEAD-ON-CHIP SEMICONDUCTOR DEVICE

This application is a continuation of application Ser. No. 08/224,196 filed Apr. 7, 1994 now abandoned, which in turn is a continuation of application Ser. No. 07/948,039, filed Sep. 21, 1992, now abandoned.

BACKGROUND OF THE INVENTION

1. Field of the Invention

This invention pertains to a semiconductor device having a so-called LOC (Lead on Chip) structure.

The LOC structure is configured by connecting to an upper surface of a semiconductor chip, an inner lead of a lead frame using a bonding agent, i.e. by attaching the semiconductor chip and the lead frame, such that the tip of the inner lead of the lead frame is positioned on top of the element-formation surface of the semiconductor chip. The bonding pad of the semiconductor chip and the tip of the inner lead are wire-bonded and resin-sealed.

Adopting the LOC structure gives increased electrical advantages and enables a chip with a large size to be installed in a small relatively package.

Regarding the electrical advantages, it becomes possible to perform wire bonding of the inner lead (for example, a bus-bar-lead) to be used as an electric power line or a ground line separately from the inner lead to be used for each circuit block such as a sense amplifier and input section 3. The result is as follows.

1. The AL (Aluminum) wiring in a chip can be shortened and speeded up.
2. The layout design of each circuit block in a chip is facilitated, and thus a semiconductor device structure with an increased number of bits can be easily developed.
3. Since the bus-bar-lead is used for wiring, the resistance of the AL wiring can be decreased thereby enabling a semiconductor device suitable for high-speed operation to be provided.
4. Since the number of bonding wires can be freely selected, it becomes possible to decrease the noise caused during operation of the sense amplifier for reading out data.

The LOC structure is also advantageous in that it can be inserted in a package with a predetermined size. Namely, the conventional package structure requires a large space for the wiring leads around a semiconductor chip but in contrast, the LOC structure can increase the ratio of the area of the chip to that of the package.

2. Description of the Related Arts

FIG. 1 is a slant view of a semiconductor device having a conventional LOC structure.

FIG. 2 shows an A—A cutaway of the semiconductor device having the conventional LOC structure shown in FIG. 1.

In FIGS. 1 and 2, 1 is a semiconductor chip (an LSI chip), 2 is an element-formation surface for the semiconductor chip 1, 3 is a lead frame, 4 is an inner lead of the lead frame 3, 5 is an outer lead of the lead frame 3, 6 is a double-sided adhesive tape for attaching the semiconductor chip 1 to the lead frame 3.

Also, 7 is the bus bar around the inner leads for a Vcc power source, 8 is the bus bar around the inner leads for a Vss power source, 9 is a bonding wire comprised of an Au wire, and 10 is a molding resin.

Such LOC structured semiconductor devices have been developed mainly as a technique for packaging DRAMs (Dynamic Random Access Memory) with capacities between four megabits [4 M] and sixteen megabits [16 M] for example, at the present and SRAMs (Static Random Access Memory) of four megabits [4 M], for example, at the present. It removes from the conventional lead frame a part called a die-pad for loading a semiconductor chip and has an inner lead extended on to the element-formation surface of the semiconductor chip.

Also, the semiconductor device shown in FIG. 1 has the bus bars 7 and 8 with low impedances comprising iron, for example, in lieu of an aluminum power source wiring formed on a conventional semiconductor chip, which are treated as wirings to be wire-bonded to peripheral circuits at multiple places, thereby improving the electrical characteristics of a power source.

FIG. 3 shows a portion of a DRAM with a conventional LOC structure. FIG. 4 shows an equivalent circuit for the portion shown in FIG. 3 and represents a circuit diagram for an output stage of the semiconductor device having the conventional LOC structure shown in FIG. 1. FIG. 4 highlights the problems with the conventional structure. FIG. 5 shows a schematic plan view of the portion shown in FIG. 3 and represents a plan view of a semiconductor device having the conventional LOC structure shown in FIG. 1. FIG. 5 highlights a problem with the conventional structure.

With the recent trend of increasing the number of bits in a DRAM, multiple output buffers 11 loaded on a semiconductor chip has increased from eight [8], to sixteen [16], to thirty-two [32], . . . .

In FIG. 4, 12 and 13 are inverters, 14 and 15 are nMOS transistors, 16 is a bonding pad, 17 is an external lead, and 18 is an external load. R1 through R3, L1, and C1 through C4 are respectively resistances, an inductance, and capacitances of the parasitic impedance to the signal path from the bonding pad 16 to the external lead 17. The external load 18 is exemplified by a model, comprising a capacitance CL, resistances R4 and R5 and current sources J1 and J2.

As shown in FIG. 3, R1 represents the resistance of the bonding wiring 9. C1 is equal to half the total capacitance of the wire bonding 9 plus the parasitic capacitance between the bonding pad 16 and the final stage (comprising a buffer including nMOS 14 and 15) of the output buffer 11. C2 is equal to half the capacitance of the wire bonding 9 and half the total capacitance of the inner lead 4. C3 is equal to half the total capacitance of the inner lead plus half the total capacitance of the external lead 17. C4 is half the total capacitance of the external lead 17. CL is the total capacitance of the external load 18. R2 is the resistance of the inner lead 4. R3 is the resistance of the external lead 5. L1 is the inductance of the line from an output buffer 11 of the final stage to the foremost end of external lead 17. Reference numeral 20 in FIG. 3 represents a block obtained by dividing a memory cell array.

An input signal comes to an input pad via leads 4A–4AA and a bonding wire 9, and then received by the inner circuit. For example, in FIG. 3, the input signal is received by a "ROW DECODER". In general, a receiver circuit for receiving an input signal is called an input buffer. In FIG. 3, the input buffer is included in "ROW DECODER", which is omitted from the FIG. 3.

Normally, as well known, an input buffer receives an input signal on a control electrode (for example, a gate terminal) of MOS transistor and the input signal is amplified for an inner circuit. In a case where an input signal is received by a voltage-driving type element, input impedance to a signal transmission path does not affect operational speed so much. Whereas, the output signal outputted from an output buffer 11 conducts slower if an impedance increases due to longer length of a transmission path (4BB–4B). As described hereinbefore, input impedance affects the operational speed of the device smaller than the output impedance does.

Since noise generated when the multiple (eight [8], sixteen [16], thirty-two [32], . . .) output buffers 11 simultaneously switch, cannot be borne by the power source line alone, an effective countermeasure for the noise has been sought.

The position of a bonding pad outputting a signal, and the length and area of an inner lead transmitting a signal, should be given more consideration in terms of the electrical characteristics than a bonding pad or an inner lead receiving a signal.

That is, it should be kept in mind that an inner lead and a bonding pad transmitting a signal need to be configured to minimize the parasitic impedance components, i.e. R1, R2, R3, L1, and C1 through C4, shown in FIG. 3 for the purpose of achieving high-speed access.

However, a semiconductor device having the conventional LOC structure shown in FIG. 1 such as the DRAM shown in FIG. 3 treats an inner lead and a bonding pad transmitting a signal in the same way as it treats an inner lead and a bonding pad for solely receiving a signal, such that the bonding pad outputting a signal is arrayed in the direction of the longer side and near the middle of the element-formation surface 2 of the semiconductor chip 1 as shown in FIG. 5. Moreover the tip 4BB of the inner lead 4B for outputting a signal is positioned on the top in the middle and in the direction of the longer side of the element-formation surface 2 of the semiconductor chip 1, as with the tip 4AA of the inner lead 4A for solely receiving a signal.

Accordingly, the values of parasitic impedance components, i.e. R1, R2, R3, L1, and C1 through C4, become large, thereby causing the problem of delaying signal transmission and inhibiting expeditious readout.

Also, a semiconductor device having the conventional LOC structure such as shown in FIG. 1 has its signal paths 19 formed with kinked lines as shown in FIG. 5, thereby preventing fast operation. In FIG. 5, 20 is a block split from a memory cell array, 4A is an inner lead for solely receiving a signal, 21A is a bonding pad for receiving a signal, 21B is a bonding pad for transmitting a signal, and 4B is an inner lead for transmitting a signal.

SUMMARY OF THE INVENTION

This invention aims at expending a data readout/write-in by providing a semiconductor device having a LOC structure with the least impedance parasitic to signal paths going to an external lead from a bonding pad for solely transmitting a signal or from a bonding pad for both transmitting and receiving a signal. Moreover it aims at further expediting high-speed readout with a shortened signal path.

The feature of the present invention resides in a semiconductor device configured by attaching a semiconductor chip to a lead frame such that the tip of the inner lead of the lead frame is positioned on top of the element-formation surface of the semiconductor chip, and by resin-sealing a wire-bonding between the bonding pad of the semiconductor chip and the tip of the inner lead is performed. A bonding pad for solely receiving a signal is formed parallel to a perimeter on top in the middle of the element-formation surface. A bonding pad for solely transmitting a signal or for both receiving and transmitting a signal is formed near the periphery of the element-formation surface. An inner lead for solely receiving a signal has its tip positioned parallel to a perimeter on top in the middle of the element-formation surface in correspondence with the bonding pad for solely receiving a signal. An inner lead solely for transmitting a signal or for both receiving and transmitting a signal has its tip positioned on top of the periphery of the element-formation surface in correspondence with the bonding pad for solely transmitting a signal or for both receiving and transmitting a signal.

BRIEF DESCRIPTION OF THE DRAWINGS

One skilled in the art can easily understand additional features and objects of this invention from the description of the preferred embodiments and some of the attached drawings. In the drawings.

DESCRIPTION OF THE PREFERRED EMBODIMENTS

Overview of the Underlying Principles

Before going into the details of an explanation of some preferred embodiments, the underlying principles of this invention are explained below.

Figure 6:
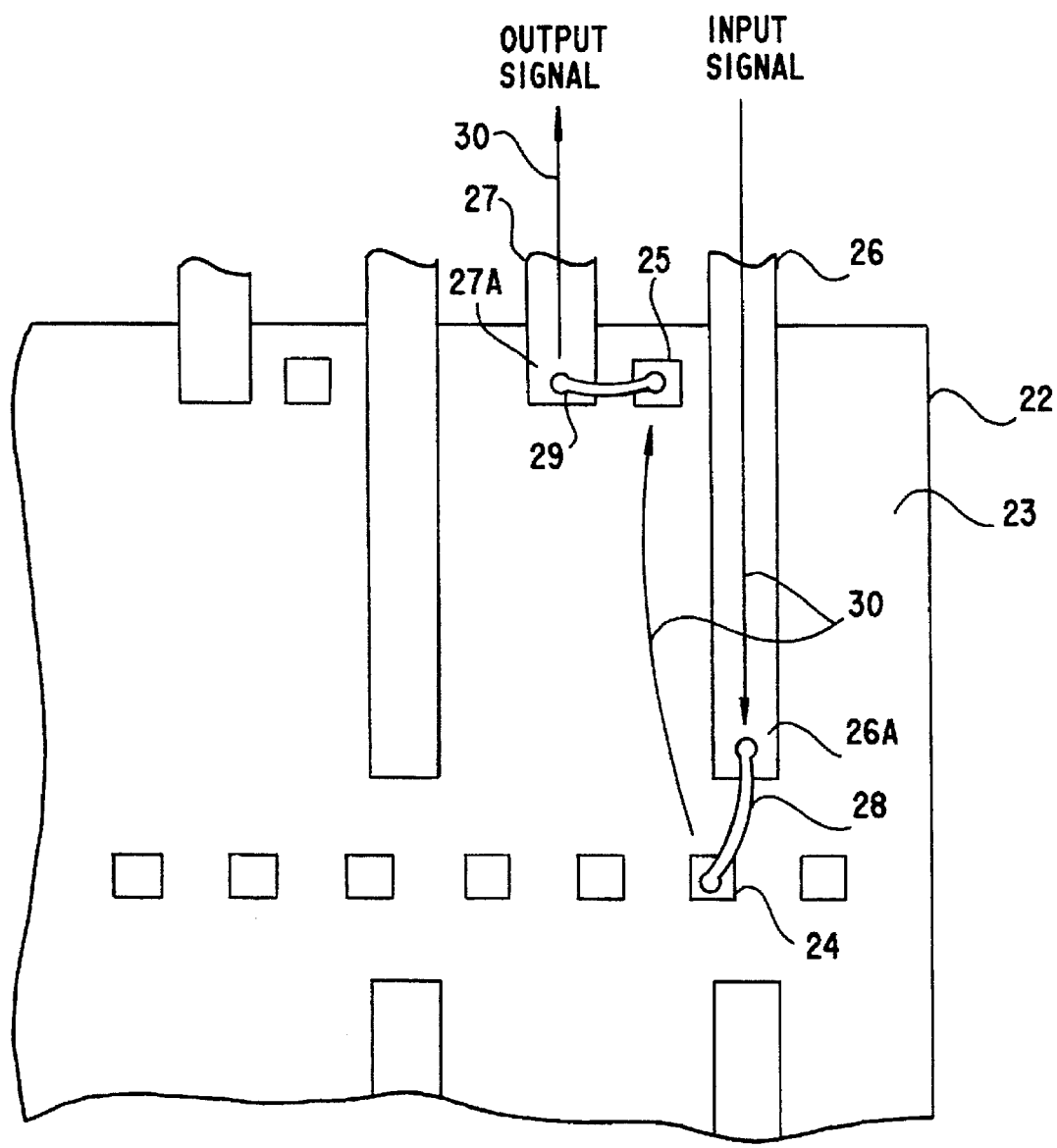
FIG. 6 is a block diagram illustrating the underlying principles of this invention.

FIG. 6 is a block diagram illustrating the underlying principles of this invention.

In FIG. 6, 22 is a semiconductor chip, 23 is an element-formation surface of the semiconductor chip 22, 24 is a bonding pad for solely receiving a signal, 25 is a bonding pad for solely transmitting a signal or for both receiving and transmitting a signal, 26 is an inner lead for solely receiving a signal, 27 is an inner lead for solely transmitting a signal or for both receiving and transmitting a signal, and 28 and 29 are bonding wires.

The semiconductor device having the LOC structure pursuant to this invention is such that the bonding pad 24 for solely receiving a signal is formed near the middle along one side of the perimeter and the bonding pad 25 for solely transmitting a signal or for both receiving and transmitting a signal is formed near the periphery of the element-formation surface 23.

Therefore, the inner lead 26 for solely receiving a signal has its tip 26A positioned on top in the middle along one side of the perimeter of the element-formation surface 23, in correspondence with the bonding pad 24 for solely receiving a signal. The inner lead 27 for both receiving and transmitting a signal has its tip 27A positioned on top of the periphery of the element-formation surface 23, in correspondence with the bonding pad 25 solely for transmitting a signal or for both receiving and transmitting a signal.

Figure 1:
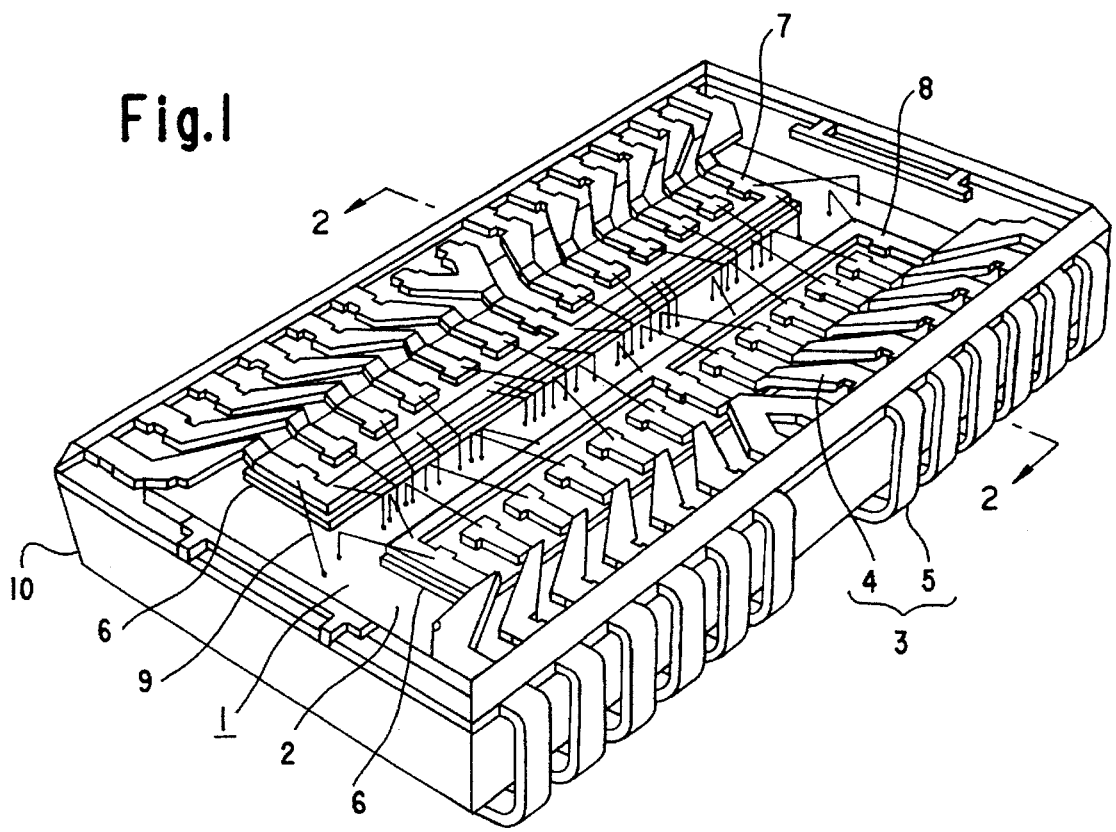
FIG. 1 is a slant view of an entire configuration of a semiconductor device having the conventional LOC structure.
Figure 2:
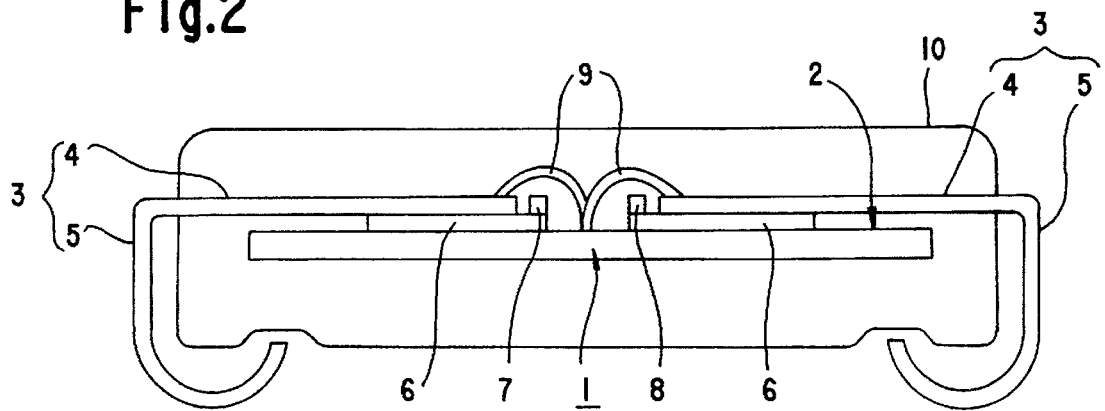
FIG. 2 shows an A—A cutaway of the semiconductor device having the conventional LOC structure shown in FIG. 1.
Figure 3:
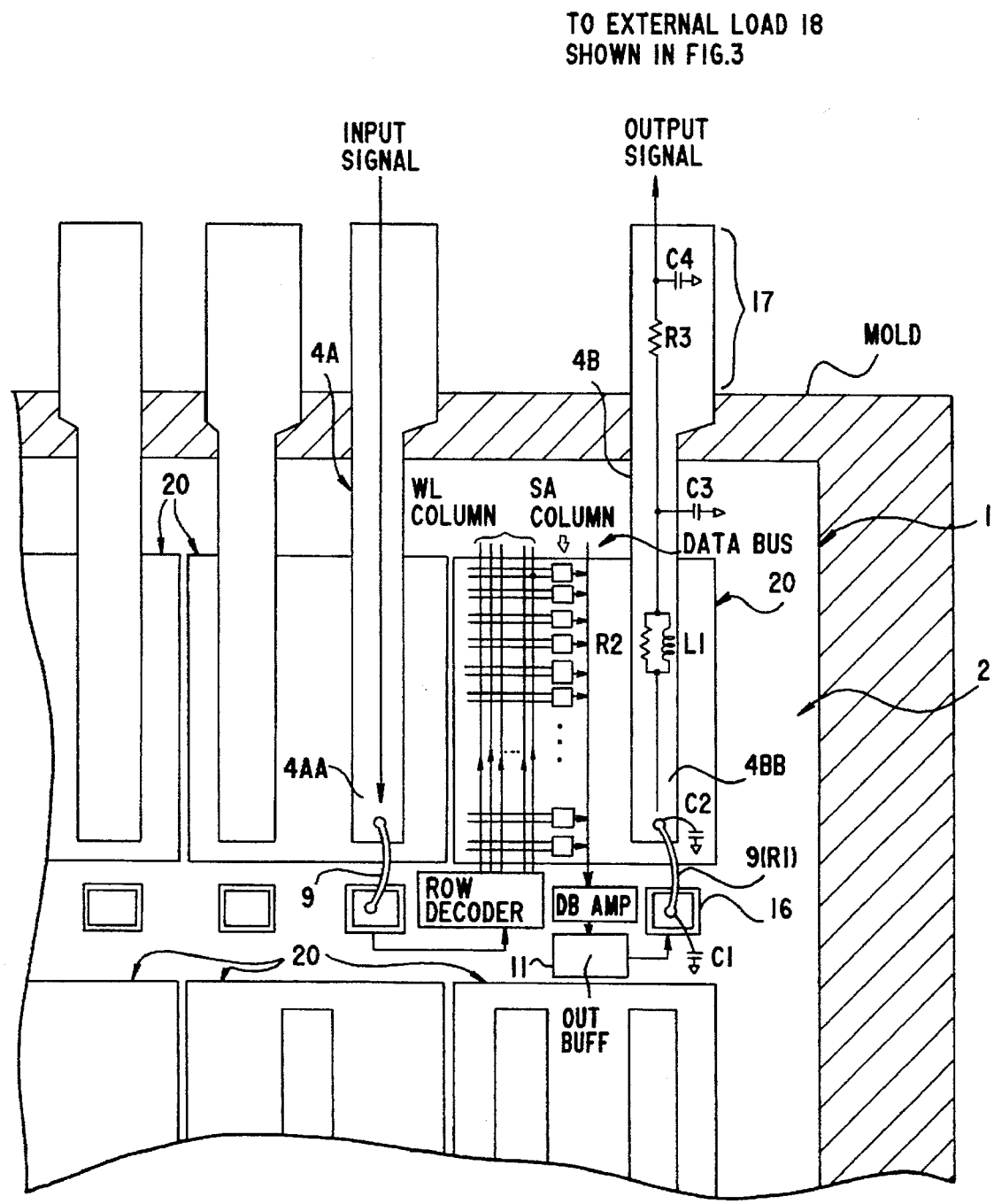
FIG. 3 shows a plan view of a DRAM with the conventional LOC structure.
Figure 4:
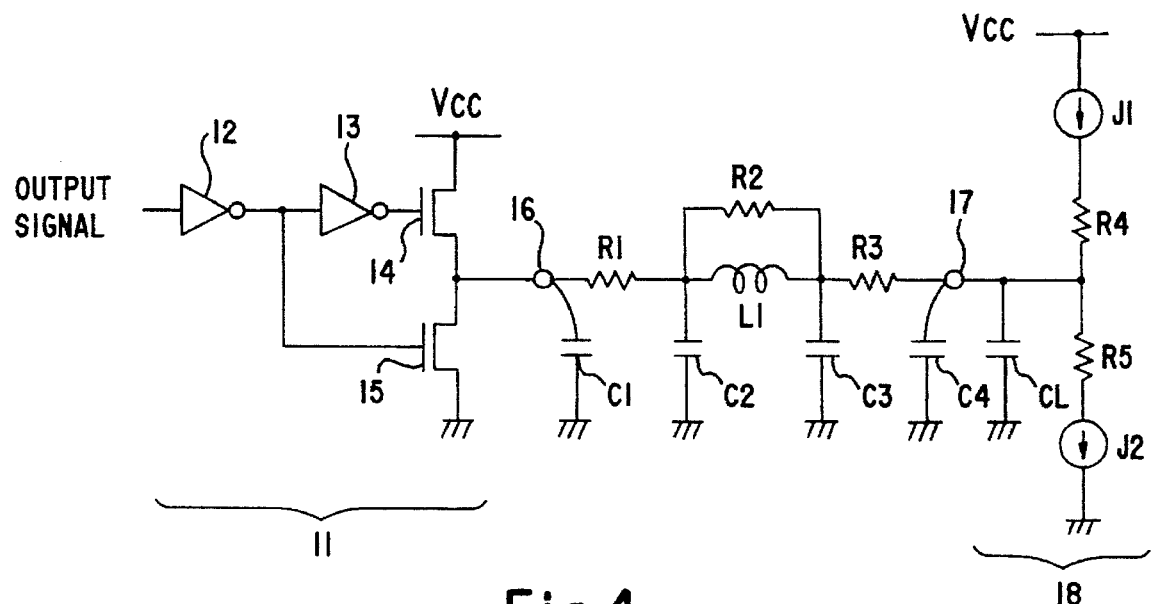
FIG. 4 is a circuit diagram for the semiconductor device having the conventional LOC structure shown in FIG. 3. It highlights the problems of the conventional structure.
Figure 5:
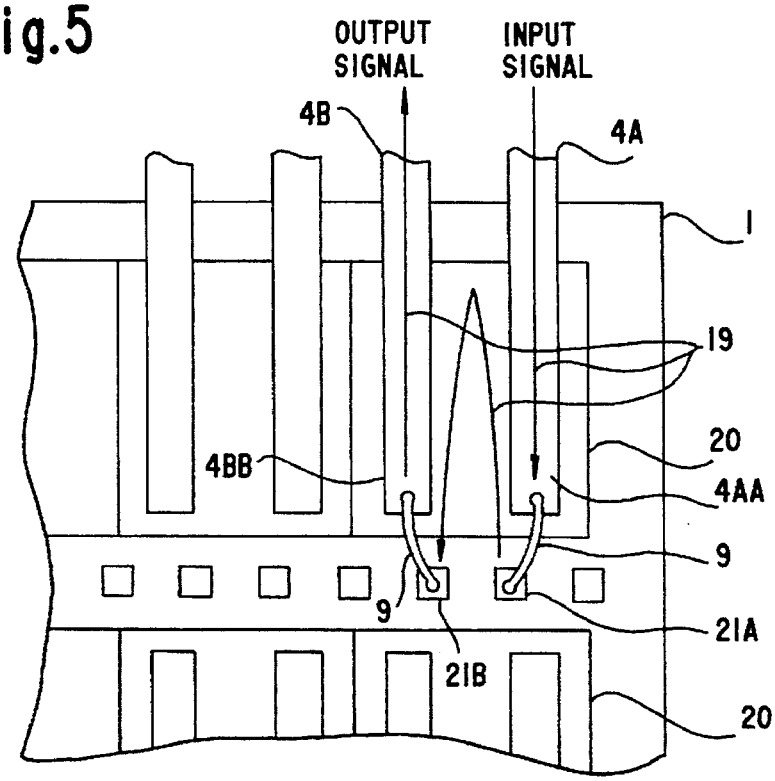
FIG. 5 shows a plan view of the semiconductor device having the conventional LOC structure shown in FIG. 1 and highlights its problems.

As shown in FIG. 5, this invention makes a signal path shorter by short-cutting the turnaround part in a chip for a signal path compared with the conventional structure shown in FIG. 5. Therefore, this invention further expedites readout.

Explanation of Concrete Embodiments

Explained below with reference to FIGS. 7 through 10, are the first through the fourth preferred embodiments of this invention, each illustrating a sixty-four megabit (64 M) DRAM to which this invention is applied.

A First Preferred Embodiment

Figure 7:
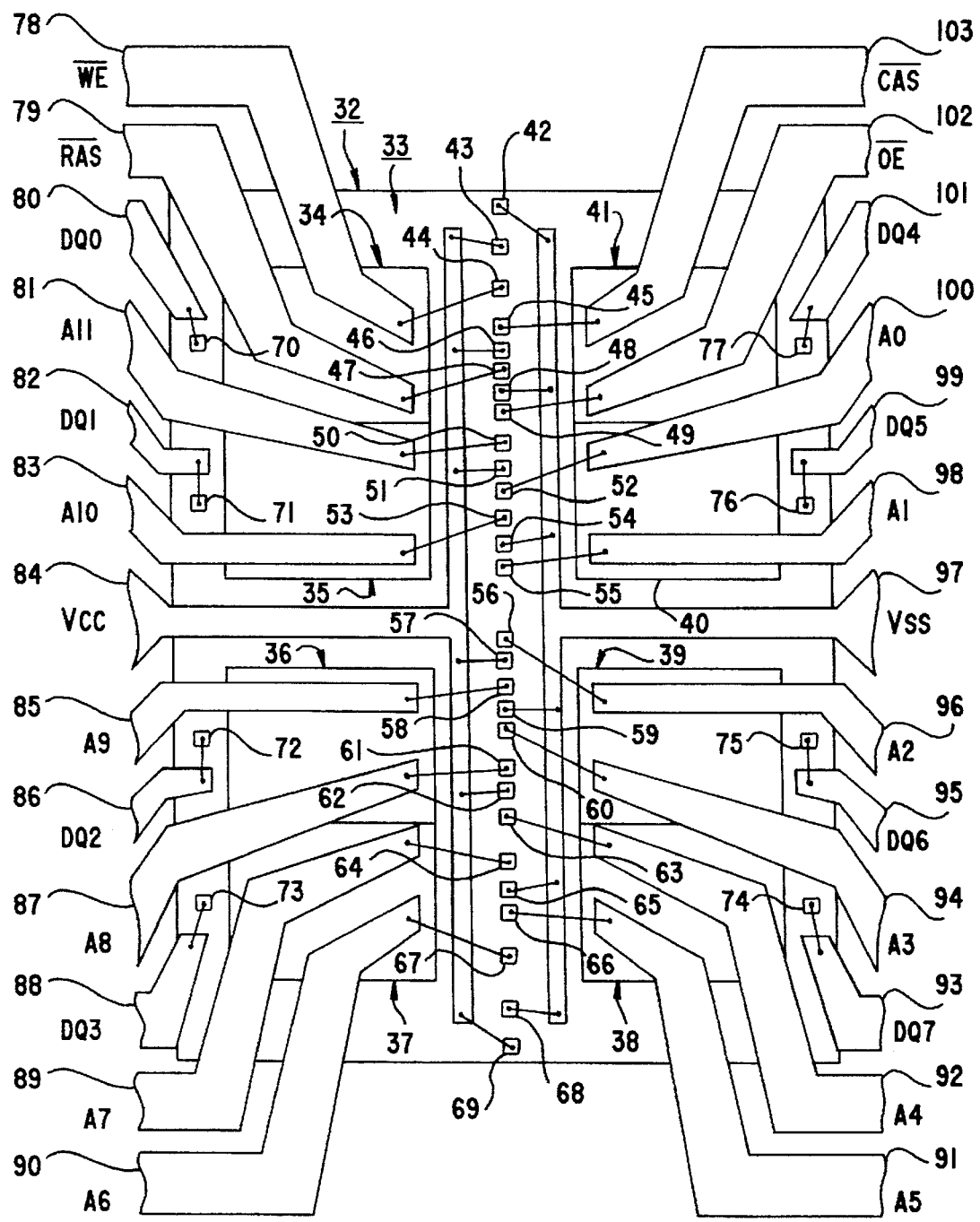
FIG. 7 shows a plan view showing a pertinent part of a first preferred embodiment.

FIG. 7 shows a plan view showing a pertinent part of the first preferred embodiment.

In FIG. 7, 32 is the main chip body, 33 is the element-formation surface of the main chip body 32, 34 through 41 are eight megabit [8 M] blocks, 42 through 77 are bonding pads, and 78 through 103 are inner leads.

Also, $\overline{RAS}$ is a row address strobe signal, $\overline{CAS}$ is a column address strobe signal, $\overline{WE}$ is a write enable, $\overline{OE}$ is an output enable signal, A0 through A11 are addresses, DQ0 through DQ7 are data input/output terminals, and Vcc and Vss are power source voltages.

Of the bonding pads 42 through 77, bonding pads 43, 46, 51, 57, 62 and 69 are for a Vcc power source, and bonding pads 42, 48, 54, 59, 65 and 68 are for a Vss power source.

Also, bonding pads 44, 45, 47 and 49 are for receiving control signals ($\overline{WE}$, $\overline{CAS}$, $\overline{RAS}$, and $\overline{OE}$). bonding pads 50, 52, 53, 55, 56, 58, 60, 61, 63, 64, 66 and 67 are for receiving addresses (A0 to A12). bonding pads 70 through 77 are for both receiving and transmitting data (DQ0 to DQ7).

Of the inner leads 78 through 103, inner lead 84 is for the Vcc power source, inner lead 97 is for the Vss power source, inner leads 78, 79, 102 and 103 are for receiving control signals ($\overline{WE}$, $\overline{RAS}$, $\overline{OE}$ and $\overline{CAS}$).

Also, inner leads 81, 83, 85, 87, 89 through 92, 94, 96, 98 and 100 are for receiving addresses (A0 to A12), and inner leads 80, 82, 86, 88, 93, 95, 99 and 101 are for both receiving and transmitting data (DQ0 to DQ7).

That is, as is evident from FIG. 6, bonding pads 43, 46, 51, 57, 62 and 69 for the Vcc power source and bonding pads 42, 48, 54, 59, 65 and 68 for the Vss power source are formed in the direction of the longer side and in the middle of the element-formation surface 33.

Consequently, inner lead 84 for the Vcc power source and inner lead 97 for the Vss power source have their tips extended in the direction of the longer side and on top in the middle of the element-formation surface 33. The foremost ends of the inner leads 84 and 97 are provided opposite to each other with a predetermined interval.

Bonding pads 44, 45, 47 and 49 for receiving control signals ($\overline{WE}$, $\overline{CAS}$, $\overline{RAS}$ and $\overline{DE}$) and bonding pads 50, 52, 53, 55, 56, 58, 60, 61, 63, 64, 66 and 67 for receiving addresses are also formed in the direction of the longer side of the element-formation surface 33 and in the area under the area provided between the foremost end of the inner lead 84 and the foremost end of the inner lead 97 on top in the middle of the element-formation surface 33.

Hence, in correspondence with those bonding pads, inner leads 78, 79, 102 and 103 for receiving control signal and inner leads 81, 83, 85, 87, 89 through 92, 94, 96, 98 and 100 have their respective tips formed along the longitudinal direction on top of the center of the element-formation surface 33.

As well, in correspondence with the positions at which bonding pads 70 through 77 are formed, inner leads 80, 82, 86, 88, 93, 95, 99, and 101 for both receiving and transmitting data (DQ0 through DQ7) have their respective tips formed on top of the periphery along the longitudinal direction of the element-formation surface 33.

Thus, in the first embodiment, the circuitry formed along the longitudinal direction in the middle receives input signals, such as the row address strobe signal $\overline{RAS}$, the column address strobe signal $\overline{CAS}$, and addresses A0 through A11.

Because the circuitry concentrates along the direction of the longer side and in the middle of the element-formation surface 33 and the power source has a low impedance due to the bus bar, the LOC structure is taken advantage of, and bonding pads provided in the middle of the element-formation surface 33 transmit access instruction signals to the eight megabit [8 M] blocks 34 through 41.

The access instruction signals are transmitted from the middle of the chip toward the chip periphery accompanied by a transmission delay of a word line, a transmission delay of a sense amplifier activation signal and a transmission delay of a column address, until they finally reach bonding pads 70 through 77 via output buffers near bonding pads 70 through 77 for both receiving and transmitting data signals and provided in the periphery of the element-formation surface 33. They are emitted to the outside via inner leads 80, 82, 86, 88, 93, 95 99 and 101 for both receiving and transmitting data signals.

Bonding pads 70 through 77 for both receiving and transmitting data signals are formed on the periphery in the longitudinal direction. Also, because inner leads 80, 82, 86, 88, 93, 95, 99 and 101 have their respective tips formed on top of the periphery in the longitudinal direction of the element-formation surface 33 correspondingly, the overlaps between the element-formation surface 33 and inner leads 80, 82, 86, 88, 93, 95, 99 and 101 for both receiving and transmitting a data signal can be minimized.

As a result, the impedances parasitic to the signal paths going to external leads from bonding pads 70 through 77 for both receiving and transmitting data signals are minimized, thereby expediting readout.

Also, the shortening of the turnaround part for a signal path from an input signal to an output signal is effective in further expediting operations.

A Second Preferred Embodiment

Figure 8:
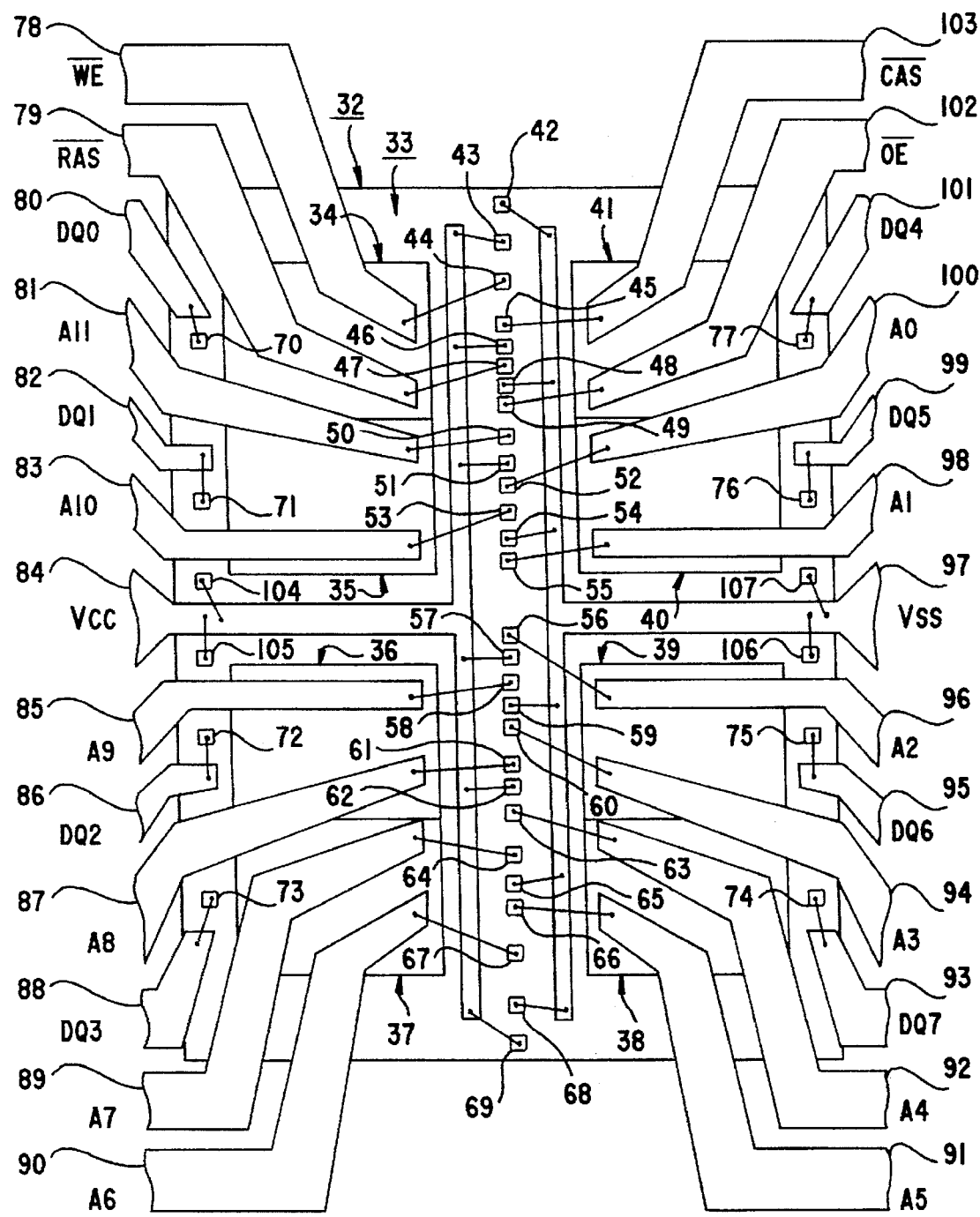
FIG. 8 shows a plan view showing a pertinent part of a second preferred embodiment.

FIG. 8 shows a plan view showing a pertinent part of a second preferred embodiment.

The second preferred embodiment aims at improving the impedance of the power source for an output buffer. What make the second preferred embodiment distinct from the first preferred embodiment are that bonding pads 104 and 105 for the Vcc power source are formed in a vicinity of eight megabit [8 M] blocks 35 and 36 on the periphery of the element-formation surface 33, and that bonding pads 106 and 107 for the Vss power source are formed in a vicinity of eight megabit [8 M] blocks 38 and 39 on the periphery of the element-formation surface 33. The second preferred embodiment configures everything else the same as the first preferred embodiment.

Namely, in the second preferred embodiment, bonding pads 104 and 105 for the Vcc power source are provided in a vicinity of eight megabit [8 M] blocks 35 and 36 as well as in a central portion of the element-formation surface 33 and thus the impedance of the power source in an output buffer portion provided within blocks 35 and 36 can be more effectively decreased than in the first embodiment. As the bonding pad for the Vss power source is provided in the vicinity of blocks 38 and 39 as well as in a central portion of the element-formation surface 33, and the impedance of the power source in the output buffer portion provided within blocks 38 and 39 can be more effectively decreased than in the first preferred embodiment. Therefore, the data signals DQ1, DQ2, DQ6 and DQ7 can be read/written with a speed higher than in the first embodiment.

A Third Preferred Embodiment

Figure 9:
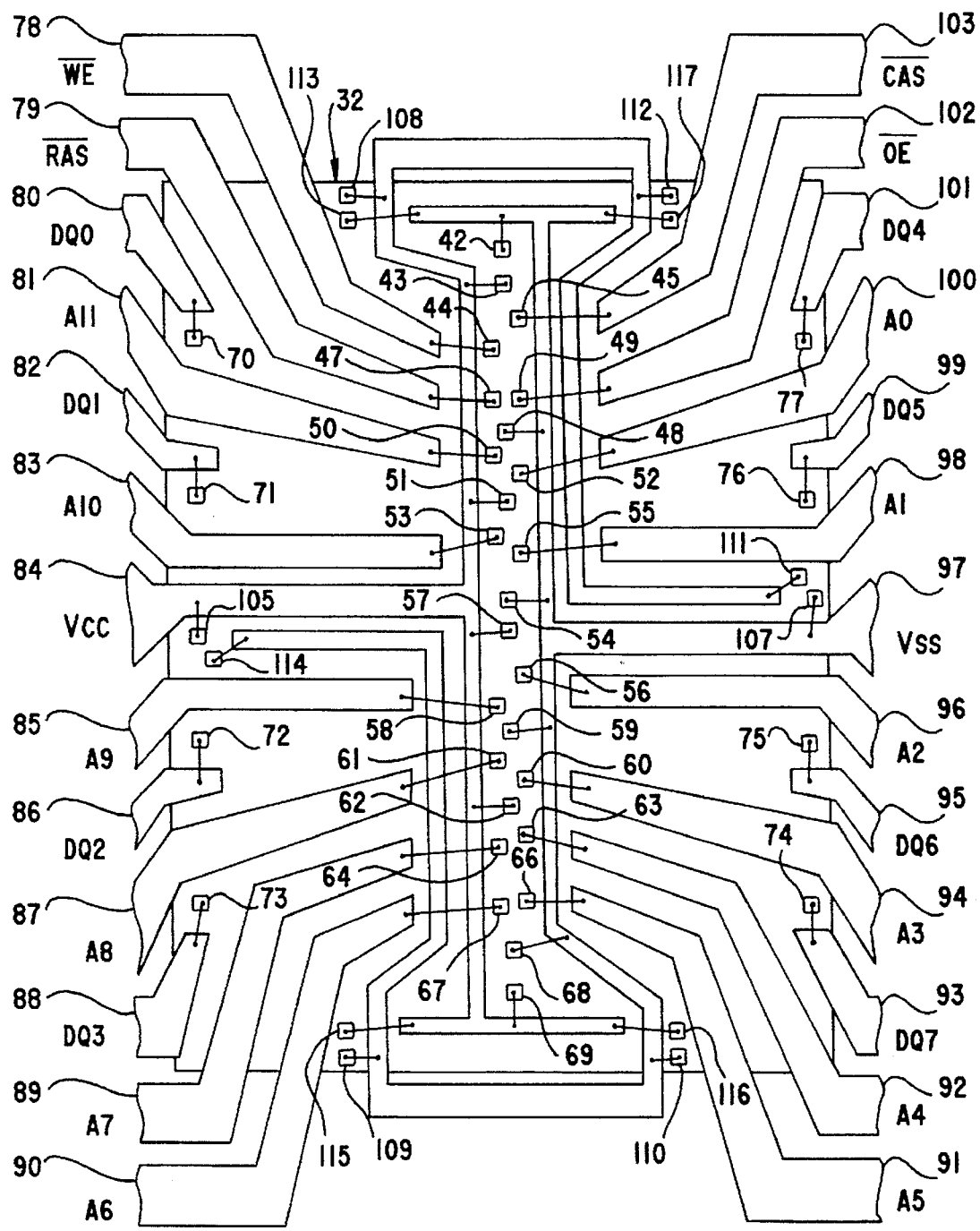
FIG. 9 shows a plan view showing a pertinent part of a third preferred embodiment.

FIG. 9 shows a plan view showing a pertinent part of a third preferred embodiment.

The third embodiment aims at further improving the impedance of the power source of an output buffer beyond the second embodiment. What make the third preferred embodiment distinct from the second preferred embodiment are that bonding pads 108 through 112 for the Vcc power source are formed near eight megabit [8 M] blocks 34, 37, 38, 40 and 41 (shown in FIGS. 7 and 8 but not shown in FIG. 9) on the periphery of the element-formation surface 33, that bonding pads 113 through 117 for the Vss power source are formed near eight megabit [8 M] blocks 34, 36, 37, 38 and 41 (shown in FIGS. 7 and 8 but not shown in FIG. 9) on the periphery of the element-formation surface 33, and that bonding pad 104 for the Vcc power source and bonding pad 106 for the Vss power source are not formed. The third preferred embodiment configures everything else the same as the second preferred embodiment.

In the third embodiment, the bonding pads for the Vcc power source are further provided in the vicinity of blocks 34, 37, 38, 40 and 41 and the bonding pads for the Vss power source are provided in the vicinity of the blocks 34, 37, 38, 40 and 41 and thus the impedance of the power source in the output buffer portion of blocks 34, 37, 38, 40 and 41 can be decreased more effectively than in the second embodiment. Therefore, a read/write for the data signal DQ0, DQ3, DQ4, DQ5 and DQ7 can be performed with a higher speed than in the second embodiment.

A Fourth Preferred Embodiment

Figure 10:
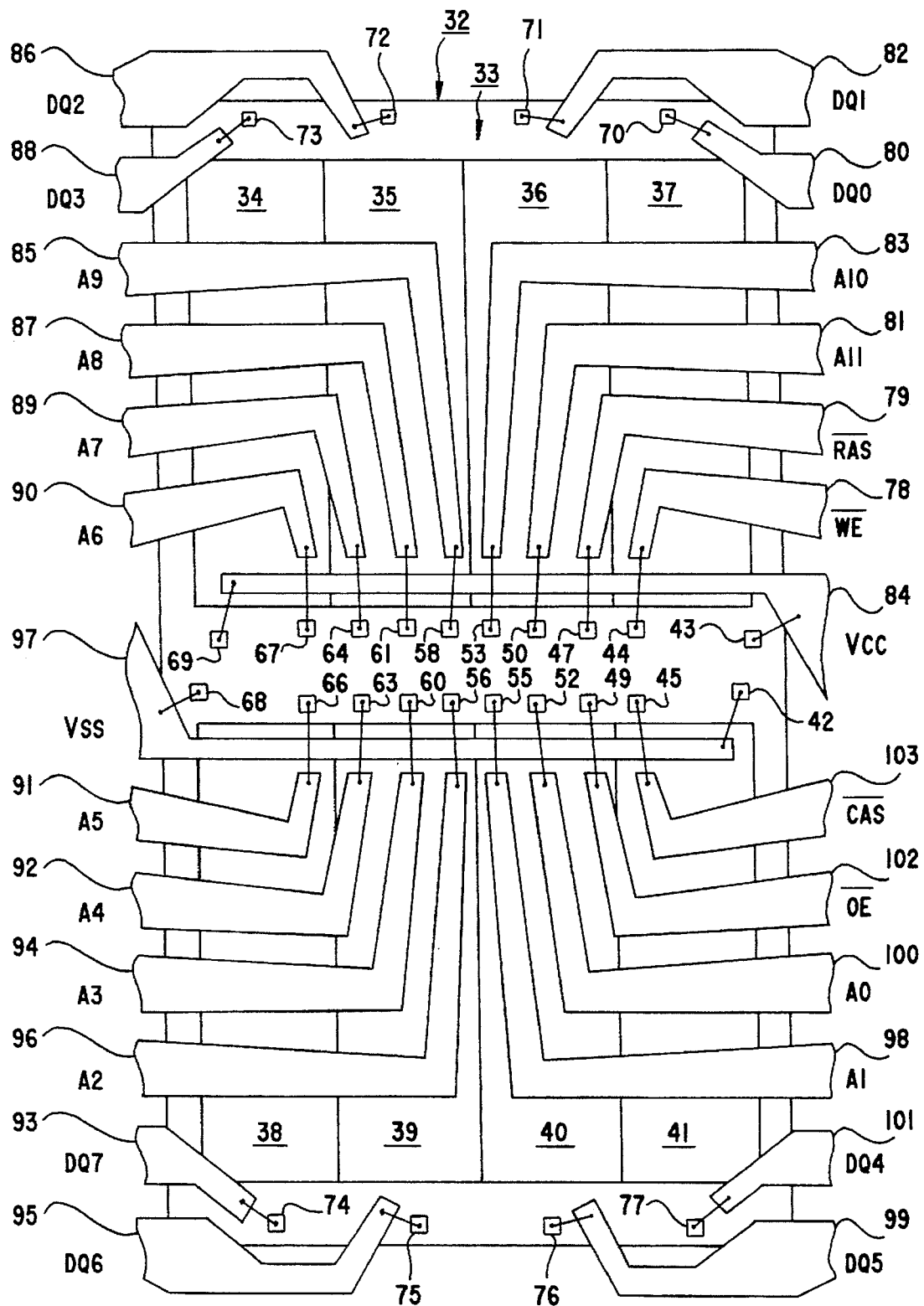
FIG. 10 shows a plan view showing a pertinent part of a fourth preferred embodiment.

FIG. 10 shows a plan view showing a pertinent part of a fourth preferred embodiment.

The fourth embodiment is such that bonding pads 43 and 69 for the Vcc power source, bonding pads 42 and 68 for the Vss power source, bonding pads 44, 45, 47 and 49 for receiving control signals, and bonding pads 50, 52, 53, 55, 56, 58, 60, 61, 63, 64, 66 and 67 are formed in the width direction, namely, in the direction of the shorter side near the center of the element-formation surface 33, and that bonding pads 70 through 77 for both receiving and transmitting data signals are formed on the short sides of the perimeter of the element-formation surface 33.

Correspondingly, inner lead 84 for the Vcc power source has its tip extended, namely, across the width on top near the center of the element-formation surface 33.

Inner leads 78, 79, 102 and 103 for receiving control signals $\overline{WE}$, $\overline{RAS}$, $\overline{DE}$, and $\overline{CAS}$, and inner leads for 81, 83, 85, 87, 89 through 92, 94, 96, 98 and 100 for receiving address signals A0 through A11 have their tips positioned along the short side on top near the center of the element-formation surface 33.

Inner leads 80, 82, 86, 88, 93, 95, 99 and 101 for both receiving and transmitting data signals DQ0 through DQ7 have their tips positioned along the short sides of the perimeter on top of the element-formation surface 33. Thus, the fourth embodiment can achieve advantages similar to the third embodiment.

As described above, since this invention enables the overlap between an element-formation surface and an inner lead for solely transmitting a signal or for both receiving and transmitting a signal, it is effective in reducing the parasitic impedance to signal paths going to an external lead from a bonding pad, and expediting a read/write operation. Moreover shortening the turnaround part of the signal path further expedites a read/write.

What is claimed is:

1. A lead-on-chip semiconductor device, having an input transistor for receiving data from an external source and an output buffer used for transmitting data out of said lead-on-chip semiconductor device, said lead-on-chip semiconductor device comprising:

a first bonding pad being coupled to the input transistor and being positioned on a middle area of an element-formation surface of said lead-on-chip semiconductor device;

a second bonding pad being coupled to the output buffer and being positioned along an outer periphery of the element-formation surface;

a first inner lead, a tip portion of said first inner lead being positioned adjacent to said first bonding pad on the element-formation surface so as to be electrically connected to said first bonding pad;

a second inner lead, a tip portion of said second inner lead being positioned adjacent to said second bonding pad on the element-formation surface so as to be electrically connected to said second bonding pad;

wherein a length of the second inner lead from the second bonding pad to the outer periphery of the element-formation surface is shorter than a length of the first inner lead from the first bonding pad to the outer periphery of the element-formation surface.

2. The semiconductor device according to claim 1 wherein the first bonding pad for only receiving a signal is formed parallel to a longitudinal axis and in the middle area of the element-formation surface.

3. The semiconductor device according to claim 1 wherein the first bonding pad for only receiving a signal is perpendicular to a longitudinal axis and in the middle area of the element-formation surface.

4. The semiconductor device according to claim 1 wherein the first bonding pad for only receiving a signal formed in the middle area of the element-formation surface includes a bonding pad for inputting power.

5. The semiconductor device according to claim 1, further comprising: a plurality of second bonding pads for inputting power to output buffers for output signals, said plurality of second bonding pads being formed near the outer periphery of said element-formation surface, in correspondence with at least some of the output buffers; and said second inner lead includes a plurality of second inner leads each formed corresponding to said second bonding pads thus formed.

6. The semiconductor device according to claim 5 wherein the first bonding pad for only receiving a signal is formed parallel to a longitudinal axis and in the middle area of the element-formation surface.

7. The semiconductor device according to claim 5 wherein the first bonding pad for only receiving a signal is perpendicular to a longitudinal axis and in the middle area of the element-formation surface.

8. The semiconductor device according to claim 5 wherein the first bonding pad for only receiving a signal formed in the middle area of the element-formation surface includes a bonding pad for inputting power.

9. A lead-on-chip semiconductor device having an input transistor for receiving data from an external source and an output buffer for transmitting data out of the lead-on-chip semiconductor device, said lead-on-chip semiconductor device comprising:
- a plurality of first bonding pads coupled to said input transistor, and positioned on a middle area of an element-formation surface of the lead-on-chip semiconductor device;
- a plurality of second bonding pads coupled to the output buffer, and positioned along an outer periphery of the element-formation surface;
- at least one first inner lead having a tip portion thereof positioned adjacent to said first bonding pad on the element-formation surface, so as to be electrically connected to the plurality of first bonding pads;
- a plurality of second inner leads, each of which has a tip portion positioned adjacent to the second bonding pad on the element-formation surface so as to extend on top of the outer periphery of the element-formation surface, to be electrically connected to the second bonding pad.

10. A Lead-On-Chip semiconductor device according to claim 9, wherein said plurality of first bonding pads are located parallel to a longitudinal axis and in the middle area of the element-formation surface.

11. A Lead-On-Chip semiconductor device according to claim 9, wherein said plurality of first bonding pads are located perpendicular to a longitudinal axis and in the middle area of the element-formation surface.

12. A Lead-On-Chip semiconductor device according to claim 9, wherein said plurality of first bonding pads formed in the middle area of the element-formation surface include at least one bonding pad for inputting power.

13. A lead-on-chip semiconductor memory device comprising:
- a first bonding pad, being positioned on a middle area of an element-formation surface of the lead-on-chip semiconductor memory device, for receiving an address signal for the lead-on-chip semiconductor memory device;
- a second bonding pad, being positioned along an outer periphery of the element-formation surface, for at least transmitting data read from the lead-on-chip semiconductor memory device;
- a first inner lead, a tip portion of said first inner lead being positioned adjacent to said first bonding pad on the element-formation surface, so as to be electrically connected to said first bonding pad;
- a second inner lead, a tip portion of said second inner lead being positioned adjacent to said second bonding pad on the element-formation surface, so as to be electrically connected to said second bonding pad.

14. The lead-on-chip semiconductor memory device according to claim 13, further comprising an output buffer for outputting the data, wherein said second bonding pad is coupled to said output buffer.

15. The lead-on-chip semiconductor memory device according to claim 14, further comprising an address decoder for decoding the address signal, wherein said first bonding pad is coupled to said address decoder.

16. The lead-on-chip semiconductor memory device according to claim 15, wherein said second bonding pad is configured to receive data to be written to the lead-on-chip semiconductor memory device.

17. A lead-on-chip semiconductor device, having an input transistor for receiving data from an external source and an output buffer used for transmitting data out of said lead-on-chip semiconductor device, said lead-on-chip semiconductor device comprising:
- a first bonding pad being coupled to the input transistor and being positioned on a middle area of an element-formation surface of said lead-on-chip semiconductor device;
- a second bonding pad being coupled to the output buffer and being positioned along an outer periphery of the element-formation surface;
- a first inner lead, a tip portion of said first inner lead being positioned adjacent to said first bonding pad on the element-formation surface so as to be electrically connected to said first bonding pad;
- a second inner lead, a tip portion of said second inner lead being positioned adjacent to said second bonding pad on the element-formation surface so as to be electrically connected to said second bonding pad;
- wherein a length of the second inner lead from the second bonding pad to the outer periphery of the element-formation surface is shorter than a length of the first inner lead from the first bonding pad to the outer periphery of the element-formation surface, such that a parasitic impedance of the second inner lead used for transmitting data out of said lead-on-chip semiconductor device is smaller than a parasitic impedance of the first inner lead used for receiving data from the external source.

18. A lead-on-chip semiconductor device, having an input transistor for receiving data from an external source and an output buffer used for transmitting data out of said lead-on-chip semiconductor device, said lead-on-chip semiconductor device comprising:
- a first bonding pad being coupled to the input transistor and being positioned on a middle area of an element-formation surface of said lead-on-chip semiconductor device;
- a second bonding pad being coupled to the output buffer which is enabled to actively drive a load and being positioned along an outer periphery of the element-formation surface;
- a first inner lead, a tip portion of said first inner lead being positioned adjacent to said first bonding pad on the element-formation surface so as to be electrically connected to said first bonding pad;
- a second inner lead, a tip portion of said second inner lead being positioned adjacent to said second bonding pad on the element-formation surface so as to be electrically connected to said second bonding pad;
- wherein a length of the second inner lead from the second bonding pad to the outer periphery of the element-formation surface is shorter than a length of the first inner lead from the first bonding pad to the outer periphery of the element-formation surface.

19. A lead-on-chip semiconductor device, having an input MOS transistor for receiving data from an external source and an output buffer comprising at least one output MOS transistor used for transmitting data out of said lead-on-chip semiconductor device, said lead-on-chip semiconductor device comprising:

- a first bonding pad being coupled to a gate terminal of the input MOS transistor and being positioned on a middle area of an element-formation surface of said lead-on-chip semiconductor device;
- a second bonding pad being coupled to a drain terminal of the output MOS transistor and being positioned along an outer periphery of the element-formation surface;
- a first inner lead, a tip portion of said first inner lead being positioned adjacent to said first bonding pad on the element-formation surface so as to be electrically connected to said first bonding pad;
- a second inner lead, a tip portion of said second inner lead being positioned adjacent to said second bonding pad on the element-formation surface so as to be electrically connected to said second bonding pad;
- wherein a length of the second inner lead from the second bonding pad to the outer periphery of the element-formation surface is shorter than a length of the first inner lead from the first bonding pad to the outer periphery of the element-formation surface.

20. A lead-on-chip semiconductor device having input transistors for receiving data from an external source and output buffers for transmitting data out of the lead-on-chip semiconductor device, said lead-on-chip semiconductor device comprising:

- a plurality of first bonding pads coupled to the corresponding input transistors, and positioned on a middle area of an element-formation surface of the lead-on-chip semiconductor device and in a region parallel to one side of the element-formation surface;
- a plurality of second bonding pads coupled to the corresponding output buffers, and positioned along an outer periphery of the element-formation surface and in a region parallel to said one side;
- at least one first inner lead having a tip portion thereof positioned adjacent to said first bonding pad on the element-formation surface, so as to be electrically connected to the plurality of first bonding pads;
- a plurality of second inner leads, each of which has a tip portion positioned adjacent to the second bonding pad on the element-formation surface so as to extend on top of the outer periphery of the element-formation surface, to be electrically connected to the second bonding pad, wherein lengths of the second inner leads from the second bonding pads to the outer periphery of the element-formation surface are shorter than lengths of the first inner leads from the first bonding pads to the outer periphery of the element-formation surface.

* * * * *